COMPENSATED GROWN JUNCTION TRANSISTOR
Filed Oct. 30, 1958
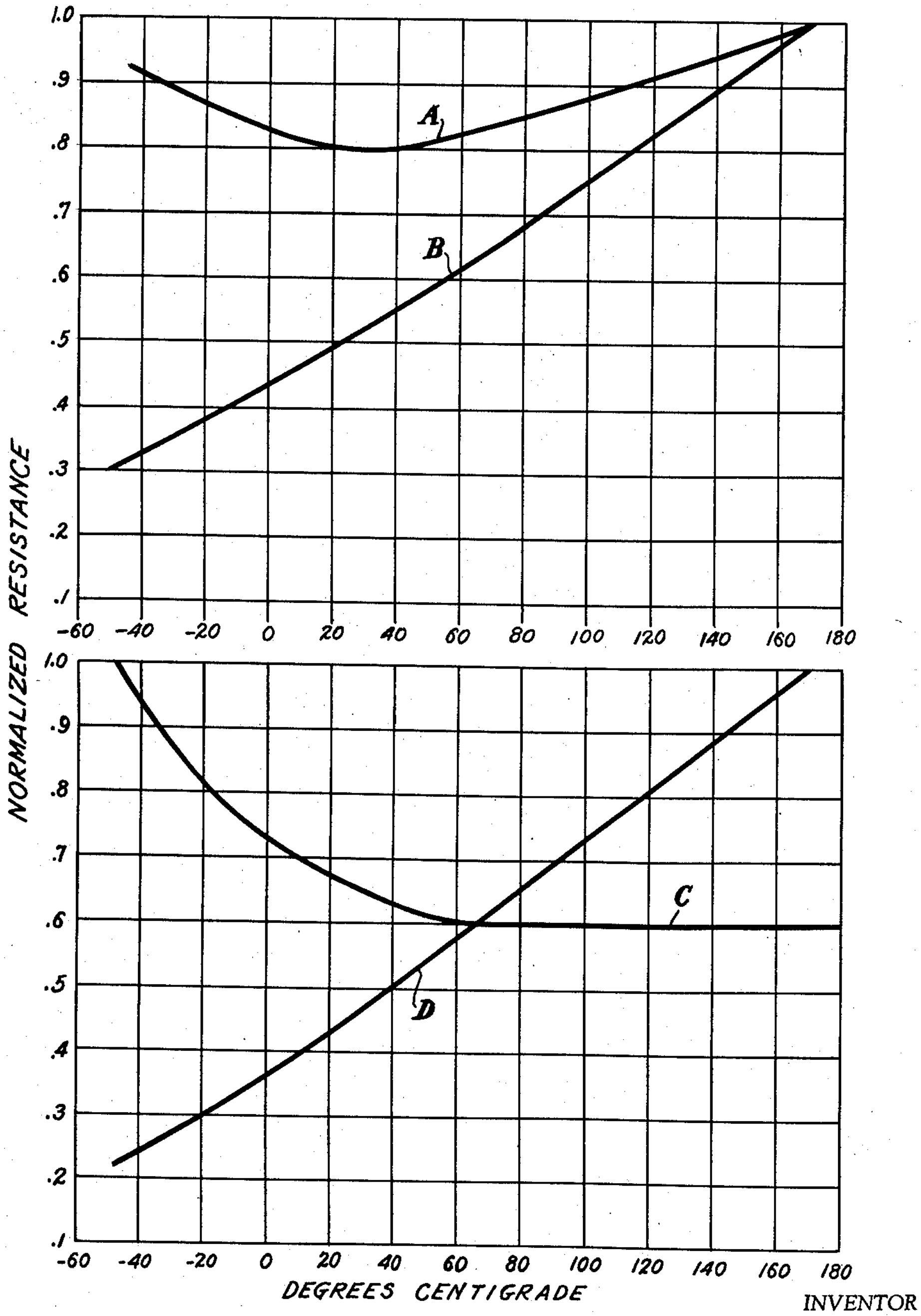
INVENTOR
Walter R. Runyan
BY Stevens, Davis, Miller & Mosher
ATTORNEYS 3,082,130
Patented Mar. 19, 1963

3,082,130

COMPENSATED GROWN JUNCTION TRANSISTOR

Walter R. Runyan, Dallas, Tex., assignor to Texas Instruments Incorporated, Dallas, Tex., a corporation of Delaware Filed Oct. 30, 1958, Ser. No. 770,801
5 Claims. (Cl. 148—33)

The present invention relates to grown junction transistors, and more particularly, to grown junction transistors in which the resistivity of the collector region is relatively insensitive to temperature changes.

One of the major difficulties in the utilization of transistors is the fact that the base and collector impedances and the gain of the transistor are sensitive to changes in ambient and internal temperatures of the transistor. In most circuit applications, the variations in the aforementioned parameters of the transistor must be compensated for by a circuit device, such as a thermistor or other temperature sensitive impedance element. Although all transistors are subject to variations in their various parameters with changes in temperature, it has been found that in grown junction transistors the collector resistivity is particularly susceptible to internal and ambient temperature changes.

It is, therefore, an object of the present invention to provide a grown junction transistor having a collector resistivity which is relatively insensitive to variations in internal and ambient temperatures.

It is another object of the present invention to provide grown junction germanium, silicon and alloy NPN or PNP type transistors having collector resistivities which are relatively insensitive to changes in internal and ambient temperatures.

In accordance with the present invention, the collector resistivity of a grown junction transistor is rendered relatively insensitive to internal and ambient temperature changes by adding, during the growing of the crystal, large quantities of impurities, both N- and P-types, while maintaining the resistivity of the collector region at a relatively high value by holding the ratio of atoms per cubic centimeter of the N- and P-type materials at a predetermined figure or within a predetermined range. The collector of a grown junction transistor is normally the first region of the transistor which is formed and in consequence the collector region has normally only a single impurity therein. At the outset of the crystal growing procedure, the intrinsic semiconductor material is molten and immediately prior to drawing of the crystal, a single impurity is normally added to the material in a predetermined amount to obtain the desired collector characteristic. This is also accomplished in an independent step so that an alloy of semiconductor and impurity can be melted together. At the end of the time required to draw a sufficient length of crystal to determine the collector region, a second impurity is added to the molten material. The second impurity overcomes the effect of the first impurity and defines a base region having both N- and P-type impurities but a predominance of that type which is the opposite of the type of the collector region. At the termination of drawing of a sufficient length of crystal to form the base region, an impurity is again added to the melt to produce the conductivity type of the collector region. The above describes a conventional double doping technique. The invention also applies to crystal produced by a grown diffused technique. Thus, in the normal transistor the collector region has but a single impurity and the base and emitter regions have two or more impurities with the emitter region having the largest quantity of impurities.

In the present invention, instead of adding a single conductivity affecting impurity to the melt at the initiation of drawing of the collector region of the crystal, both N- and P-type impurities are added in relatively large amounts, but in such proportions that one of the types predominates. Further, the ratio of the atoms per cubic centimeter of the two conductivity types must be such as to maintain a relatively high resistivity in the collector region.

The degree of compensation obtainable by the method set forth above is determined by the total number of impurity atoms of both impurity types per cubic centimeter of the crystal and an acceptable range of values has been found to lie between $10^{17}$ and $10^{19}$ atoms per cubic centimeter. In addition, the ratio of the atoms per cubic centimeters of the two impurity types must be maintained at such a value that the resistivity of the collector region is maintained at an acceptable value, for example, at a value between 0.7 and 5.0 ohm-centimeters.

In one specific example of the preparation of a transistor conforming to the present invention, at the beginning of the drawing of a silicon crystal, ten milligrams of antimony and 17 milligrams of gallium are added to a melt of 50 grams of silicon, so that a total of approximately $3.5 \times 10^{17}$ impurity atoms are disposed in each cubic centimeter of the crystal. The atomic weight of pure gallium is such that there are $8.64 \times 10^{18}$ atoms of gallium per milligram of the material while there are $4.94 \times 10^{18}$ atoms per milligrams of antimony and therefore the atoms of gallium predominate in the melt by a ratio of 2.99:1. The resistivity of the collector region thus formed is 0.8 ohm-centimeter and the normalized resistance v. temperature characteristic of the collector region of the compensated transistor is illustrated on graph 1 in the single FIGURE of the accompanying drawing as curve A. The normalized resistance of a transistor or one of its regions is the ratio of the resistance at a particular temperature to the maximum resistance at any temperature.

Reference is now made to the figure of the accompanying drawing, which has two comparative graphs, each comparing the normalized resistance v. temperature characteristic of a compensated and uncompensated collector region. It will be noted by reference to curve A, graph 1, that at —44° C., the normalized resistance of the collector region is 0.92 and that this ratio falls to 0.8 at 40° C and rises again to a ratio of 1 at 170° C. The curve for an uncompensated silicon transistor having a resistivity of 0.8 ohm-centimeter is also illustrated in graph 1 and referenced as curve B. More particularly, curve B represents a grown junction silicon transistor in which a sufficient quantity of antimony also has been added to produce the desired resistivity. It will be noted that the normalized resistance rises almost linearly from a value of 0.3 at —50° C. to a value of 1 at 170°, producing a maximum variation of 3⅓ times minimum value as opposed to a maximum change in the compensated curve A of 1.25 times minimum value.

In a second example of a transistor of the present invention, 60 milligrams of antimony and 105 milligrams of gallium are added to 50 grams of silicon melt so as to provide approximately $2 \times 10^{18}$ impurity atoms per cubic centimeter of the silicon crystal produced upon pulling of the material in the melt. The amounts employed are such as to produce a collector resistivity of 1.5 ohm centimeters. Curve C of graph 2 represents the normalized resistance v. temperature charcteristic for the collector region produced by this latter example, and it will be noted that the resisitivity of the collector is completely flat from 60° to 180° C. and rises from a value of 0.( at 60° C. to 1 at approximately —50° C. Curve D of graph 2 is a plot of a silicon, grown junction transistor having a resistivity of 1.5 ohm-centimeters produced by the addition of antimony only to the silicon melt. Curve D rises from a value of .22 at approximately −50° C. to a ratio of 1 at 170° C. along a substantially linear curve. The relative stability with respect to temperature of the curves C and D is readily apparent from the graph.

Although the invention has been described in terms of particular embodiments, nevertheles changes and modifications obvious to those skilled in art from a knowledge of the present invention, are deemed to be within the scope and spirt of the invention.

What is claimed is:

1. A grown junction transistor comprising a single grown crystal of semiconductor material composed of two end regions of the same conductivity-type and an intermediate region of the opposite conductivity-type, each of said end regions containing both N-type and P-type impurity atoms distributed substantially uniformly along the length thereof with an absence of substantial impurity distribution gradients in either of said end regions, one of said end regions containing a total of approximately $10^{17}$ to $10^{19}$ atoms per cubic centimeter of N-type and P-type impurity materials, the ratio of atoms per cubic centimeter of said N-type and P-type impurity materials being such as to establish the resistivity of said one of said end region within the range of 0.7 to 5.0 ohm-centimeters.

2. A grown junction transistor as defined in claim 1 wherein said semi-conductive material is silicon.

3. A grown junction transistor as defined in claim 1 wherein said semi-conductive material is germanium.

4. A grown junction transistor as defined in claim 1 wherein said one end region exhibits N-type conductivity.

5. A grown junction transistor as defined in claim 1 wherein said one end region exhibits P-type conductivity.

References Cited in the file of this patent

UNITED STATES PATENTS

| | | |
|---|---|---|
| 2,774,695 | Burton | Dec. 18, 1956 |
| 2,818,361 | Anderson | Dec. 13, 1957 |
| 2,843,516 | Herlet | July 15, 1958 |
| 2,878,152 | Runyan et al. | Mar. 17, 1959 |
| 2,899,343 | Statz | Aug. 11, 1959 |